RE 25834

June 20, 1961 J. R. GELZER ET AL 2,989,710

ADJUSTABLE INDUCTANCE UNIT

Filed Nov. 3, 1958

INVENTORS
JOHN R. GELZER AND
RICHARD F. REED
BY
Mason, Kolehmainen, Rathburn & Wyss
ATT'YS.

United States Patent Office 2,989,710

Patented June 20, 1961

2,989,710

ADJUSTABLE INDUCTANCE UNIT

John R. Gelzer, Barrington, Ill., and Richard F. Reed, Bloomington, Ind., assignors to Sarkes Tarzian, Inc., Bloomington, Ind., a corporation of Indiana Filed Nov. 3, 1958, Ser. No. 771,418
5 Claims. (Cl. 336—20)

The present invention relates to adjustable inductance units and it more particularly relates to adjustable inductance units which may be directly mounted on the selector switches of VHF television tuners.

According to present day standards, the VHF, or very high frequency television band, is divided into a lower VHF band comprising channels 2 through 6, inclusive, and extending from 54 to 88 megacycles and a high frequency VHF band comprising channels 7 through 13, inclusive, and extending from 174 to 216 megacycles. In switch type VHF television tuners it is customary to connect inductance increments between adjacent ones of twelve contacts on rotary switches having twelve VHF channel selecting positions. The inductance increments may thus be selectively and accumulatively added to the various tuned circuits of the tuner to selectively tune them to the frequencies assigned to each of the twelve VHF channels. Inasmuch as each television channel, whether in the higher or lower VHF television bands, occupies a bandwidth of 6 megacycles, the inductance increments used for switching between the higher band channels have a considerably lower inductance value than do the incremental inductances used for switching between the channels in the lower VHF band. While the exact inductance values used depends upon the requirements of the circuits used in the particular tuner, the lower band channel incremental inductances are ordinarily provided by air core coils having at least five turns while the higher band inductance increments are provided by coils comprising a single turn or less. Since the lower band inductances utilize a substantial number of turns, they can be readily adjusted by deforming their shape until the desired inductance value is provided but a similar adjustment of the single turn coil of the higher band inductances is substantially more difficult and the range of adjustment is very much limited. Therefore, a serious problem confronting the designers of VHF television tuners has been the provision of adjustable inductance increments for channel switching in the higher VHF band. Of course, the manufacturing cost of television tuners is always an important factor to be considered and any means employing such switching must have a cost commensurate with the cost of the other components in the tuner. By way of example, an integral inductance unit for the entire high frequency band has been provided in the past by means of a metallic stamping and adjustability of the inductance value between adjacent contacts was effected by a plurality of adjustable slugs threadedly connected to the stampings between adjacent contacts. While such an arrangement lends itself to rapid and accurate assembly of the tuner switch, its manufacturing cost is very high, and therefore, it is an object of this invention to provide a less expensive and yet equally good incremental inductance unit for switching between the channels in the higher VHF television band.

Another object of the present invention is to provide a new and improved incremental inductance unit suitable for use in VHF television tuners of the switch type.

Another object of the present invention is to provide a new and improved multiple contact rotary switch for use in VHF television tuners.

A further object of the present invention is to provide a new and improved incremental inductance unit which is simple in construction, low in manufacturing cost and which enables individual adjustment of a plurality of inductive increments thereof throughout a sufficiently wide range of inductance values to insure satisfactory switching between television channels in the upper VHF television band.

Briefly, the above and further objects are realized in accordance with the present invention by providing a multiple inductance unit which can be easily mounted on a rotary selector switch to provide a plurality of adjustable inductance increments between adjacent ones of a number of the stator contacts of the switch. The inductance unit preferably comprises a soft metal stamping having an arcuate body portion, a plurality of inwardly directed radial protrusions, and a plurality of contact tabs interposed between the protrusions. The tabs are adapted to be connected to the stator contacts of the switch and the protrusions extend a substantial distance between the contacts toward the center of the switch. The unit is stamped from a flat metal sheet and at the outset the arcuate body portion and the radial protrusions are both flat and lie in a common plane. Inasmuch as the protrusions and the body are soft, the inductance values connected between adjacent contacts of the switch can be adjusted by bending the protrusions out of the plane of the body and out of the space directly between the contacts. Moreover, since the protrusions and the body are planar, a relatively large range of adjustment is provided.

The invention, both as to its organization and method of operation, together with further objects and advantages thereof, will best be understood by reference to the following detailed description taken in connection with the accompanying drawings, in which.

Figure 1:
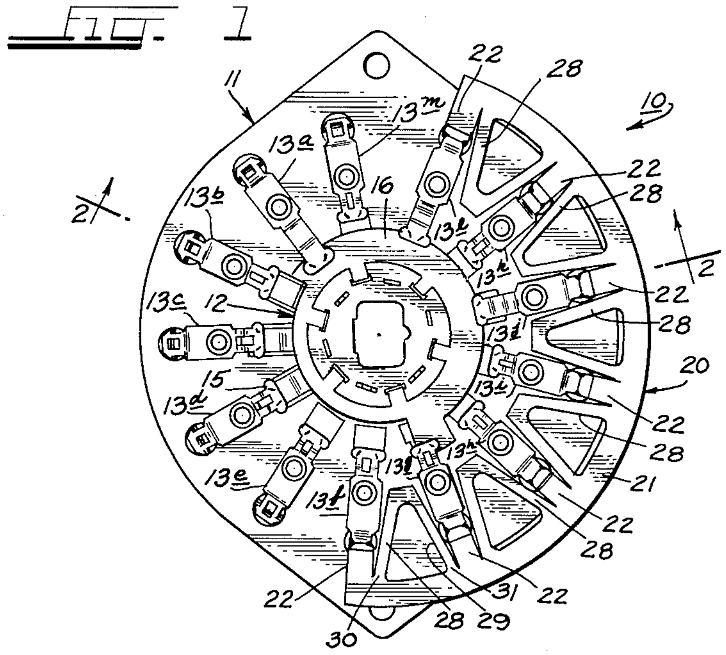
FIG. 1 is a plan view of a multiple contact rotary switch embodying the present invention.

Referring now to the drawings and particularly to FIG. 1 thereof, there is shown a multiple contact rotary switch 10 which comprises as its principal parts an insulating stator wafer 11, a rotor 12 which is journaled in a central aperture in the wafer 11, and a set of contacts 13 which are mounted on the wafer 11. The contacts 13 each include an inwardly directed contact portion 15 which is selectively engaged by an irregularly shaped conductive wiper 16 mounted on the rotor 12. The contacts 13 comprise a first group of contacts 13*a*, 13*b*, 13*c*, 13*d*, and 13*e*, which are used for selective switching between the channels in the lower VHF television band, and therefore, a plurality of inductance coils (not shown) may be connected between adjacent ones of the contacts 13*a* through 13*e*, inclusive. The contacts 13 further comprise a second group of contacts 13*f*, 13*g*, 13*h*, 13*i*, 13*j*, 13*k*, and 13*l*, which are used for switching between the channels in the higher VHF television band. A thirteenth contact, designated 13*m*, may be used to adapt the tuner for use with a UHF tuner, in which case the contact 13*m* is selectively connected to the wiper 16 when the switch 10 is in the UHF signal receiving position.

Figure 2:
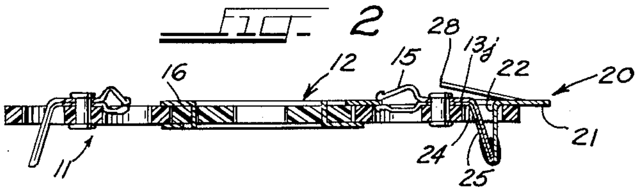
FIG. 2 is a cross sectional view of the switch of FIG. 1 taken along the line 2—2 thereof.
Figure 3:
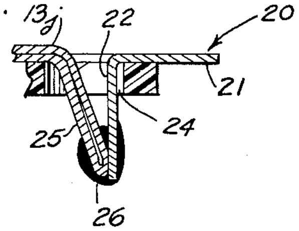
FIG. 3 is a greatly enlarged fragmentary view of a portion of FIG. 2 showing the connection between the switch contact and the incremental inductance unit.

In order to provide the inductance increments necessary to enable switching between the channels in the high VHF television band, there is provided in accordance with the present invention an incremental inductance unit 20 which is stamped from a sheet of soft metal, such as copper, and which comprises an arcuate body portion 21 from which a plurality of contact tabs 22 extend. As best shown in FIGS. 2 and 3, the tabs 22 are L-shaped in cross section, having a first portion which is immediately adjacent to and coplanar with the body 21 and which extends toward the axis of rotation of the rotor 12. Preferably, the body 21 is concentric with the arc on which the contact clips 13 are mounted. The marginal end portion of the tabs 22 depend into apertures 24 provided in the stator wafer 11. The terminals 25 of the contact clips 13 also depend through the apertures 24, and the tabs 22 and terminals are coupled together by means of a solder connection 26 provided on the lower side of the stator 11. Since the contact clips 13 are eyeleted to the wafer 11, the conductive increment unit 20 is thereby secured to the wafer 11.

In order to provide an adjustable inductance value between adjacent ones of the contact clips 13, the inductance unit 20 further includes a plurality of inwardly directed radial protrusions 28 which are interposed between the tabs 22 and extend a substantial distance between those contact clips 13 which are connected to the tabs 22. Inasmuch as the unit 20 is stamped from a sheet of soft metal, the protrusions 28 may be readily bent up out of the plane of the body 21 and thus out of the space directly between the adjacent contact clips 13, thereby to adjust the value of inductance connected between these contact clips 13.

In order to facilitate bending of the protrusions 28 for adjustment of the inductance values, each of the protrusions is provided with a generally triangular aperture 29 which extends to the body 21. Accordingly, the protrusions 28 are generally V-shaped and connected to the arc 21 by relatively narrow sections 30 and 31 whereby the protrusions 28 may be easily and accurately bent or deflected to the desired position. It is particularly desirable that the metal from which the inductance unit 28 is formed be soft and not resilient so that it will take a permanent set very readily in whatever position the protrusions 28 are placed during adjustment. This eliminates guesswork in the adjustment of the inductance values during alignment of the tuner.

It will be understood that since the inductance values required will vary from one tuner design to another as well as between stages of the same tuner, different sized protrusions 28 and different sized apertures 29 may be selected to provide whatever inductance values are required.

While there has been described what is at present considered to be the preferred embodiment of the invention, it will be understood that various modifications may be made therein which are within the true spirit and scope of the invention as defined in the appended claims.

What is claimed as new and is desired to be secured by Letters Patent of the United States is:

1. In a television tuner, the combination of a multiple contact rotary switch for adjusting in discrete increments the tuning of a tuned circuit in said tuner, said switch including a plurality of arcuately disposed contact clips, and a generally arcuate stamping formed of a soft, non-resilient metal, said stamping being flat and including a plurality of first inwardly directed radial portions connected to respective ones of said contacts and a plurality of second inwardly directed incremental inductance portions interposed between said first portions and extending a substantial distance between said contacts.

2. A multiple contact rotary switch for use in a high frequency tuner, comprising an insulating stator wafer, a wiper rotatably mounted on said wafer, a plurality of contacts mounted on said wafer for selective engagement by said wiper, said contacts being arcuately disposed on said wafer, and an adjustable inductance member, said member having a generally arcuate connecting portion spanning a plurality of said contacts and disposed beyond the ends thereof, said member further having a plurality of inwardly directed tabs respectively connected to said spanned contacts and a plurality of inwardly directed adjustable protrusions interposed between said tabs, said latter portions comprising incremental inductances and being relatively soft and bendable so as to permit adjustment of the inductance values between adjacent ones of said spanned contacts.

3. A multiple contact rotary switch comprising an annular stator wafer made of an insulating material, a wiper rotatably mounted on said wafer, a plurality of contact clips riveted to said wafer on one face thereof, said clips being selectively engageable by said wiper, said stator including a plurality of apertures respectively disposed along the radii on which said clips are positioned, the end portions of said clips depending through said apertures and protruding beyond the opposite face of said stator, and an incremental inductance member of generally arcuate configuration, said member including a plurality of spatially disposed offset tabs respectively depending through said apertures and connected to said clips on said opposite side of said stator wafer.

4. In a television tuner, the combination of a multiple contact rotary switch including a rotor and a stator on which a plurality of contacts are mounted for selective engagement by said rotor, a generally arcuate metal stamping mounted on said stator, said stamping comprising an arcuate portion disposed beyond the ends of a plurality of said contacts, a plurality of tabs extending from said arcuate portion at substantial right angles thereto and respectively depending into apertures in said stator through which portions of said contacts also respectively depend, said tabs being soldered to said contacts to secure said stamping to said switch and to connect said plurality of said contacts to spatially disposed locations on said arcuate portion, said stamping further comprising a plurality of radially extending V-shaped inductive increments respectively interposed between said tabs and at least partially disposed between adjacent ones of said plurality of contacts, said increments being substantially planar and pivotable out of the plane of said arcuate portion thereby to provide, between said plurality of contacts, inductive increments of adjustable value.

5. A multiple inductance stamping for connection to a multiple contact rotary switch used in a television tuner, comprising a flat arcuate portion, a plurality of spatially disposed tabs protruding from said arcuate portion, said tabs lying substantially transverse to the plane of said arcuate portion, and a plurality of inductive increments integral with said arcuate portion and disposed between said tabs, said increments extending toward the central axis of said arcuate portion, said stamping being metal and the connection of said increments to said arcuate portion being sufficiently flexible to permit manual bending of said increments with respect to the plane of said arcuate portion to adjust the inductance value of said increments.

References Cited in the file of this patent

UNITED STATES PATENTS

| | | |
|---|---|---|
| 2,113,463 | Hall | Apr. 5, 1938 |
| 2,513,393 | Frey | July 4, 1950 |